United States Patent
Fischer et al.

(10) Patent No.: US 8,573,153 B2
(45) Date of Patent: Nov. 5, 2013

(54) MULTI-PART ELECTRODE FOR A SEMICONDUCTOR PROCESSING PLASMA REACTOR AND METHOD OF REPLACING A PORTION OF A MULTI-PART ELECTRODE

(75) Inventors: Andreas Fischer, Castro Valley, CA (US); William S. Kennedy, Fremont, CA (US); Peter Loewenhardt, Pleasanton, CA (US); David Trussell, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 203 days.

(21) Appl. No.: 12/954,060

(22) Filed: Nov. 24, 2010

(65) Prior Publication Data

US 2011/0067814 A1    Mar. 24, 2011

Related U.S. Application Data

(62) Division of application No. 10/445,146, filed on May 23, 2003, now Pat. No. 7,861,667.

(60) Provisional application No. 60/383,164, filed on May 23, 2002.

(51) Int. Cl.
*C23C 16/00* (2006.01)
*H01L 21/00* (2006.01)

(52) U.S. Cl.
USPC .................................. 118/723 E; 156/345.43

(58) Field of Classification Search
USPC ....... 118/723 E; 156/345.43, 345.44, 345.45, 156/345.46, 345.47
See application file for complete search history.

(56) References Cited

U.S. PATENT DOCUMENTS

| | | | |
|---|---|---|---|
| 4,230,515 A | 10/1980 | Zajac | |
| 4,297,162 A | 10/1981 | Mundt et al. | |
| 4,340,462 A | 7/1982 | Koch | |
| 4,579,618 A | 4/1986 | Celestino et al. | |
| 4,595,484 A | 6/1986 | Giammarco et al. | |
| 4,610,774 A | 9/1986 | Sakata et al. | |
| 4,767,641 A | 8/1988 | Kieser et al. | |

(Continued)

FOREIGN PATENT DOCUMENTS

| | | |
|---|---|---|
| EP | 0693769 A2 | 1/1996 |
| JP | 06-291064 | 10/1994 |

(Continued)

OTHER PUBLICATIONS

Merriam-Webster Online Dictionary, 2007, "seal", http://www.merriam-webster.com.2007 (Nov. 8, 2007).

(Continued)

*Primary Examiner* — Sylvia R MacArthur
*Assistant Examiner* — Anna Crowell
(74) *Attorney, Agent, or Firm* — Buchanan Ingersoll & Rooney PC

(57) ABSTRACT

An improved upper electrode system has a multi-part electrode in which a central portion of the electrode having high wear is replaceable independent of an outer peripheral portion of the electrode. The upper electrode can be used in plasma processing systems for processing semiconductor substrates, such as by etching or CVD. The multi-part upper electrode system is particularly useful for large size wafer processing chambers, such as 300 mm wafer processing chambers for which monolithic electrodes are unavailable or costly.

14 Claims, 2 Drawing Sheets

(56) References Cited

U.S. PATENT DOCUMENTS

| | | | |
|---|---|---|---|
| 4,792,378 A | 12/1988 | Rose et al. | |
| 4,820,371 A | 4/1989 | Rose | |
| 4,885,074 A | 12/1989 | Susko et al. | |
| 4,960,488 A | 10/1990 | Law et al. | |
| 4,979,467 A | 12/1990 | Kamaji et al. | |
| 5,074,456 A | 12/1991 | Degner et al. | |
| 5,273,588 A | 12/1993 | Foster et al. | |
| 5,298,103 A | 3/1994 | Steinberg et al. | |
| 5,422,139 A | 6/1995 | Fischer | |
| 5,472,565 A | 12/1995 | Mundt et al. | |
| 5,522,934 A | 6/1996 | Suzuki et al. | |
| 5,569,356 A | 10/1996 | Lenz et al. | |
| 5,571,366 A | 11/1996 | Ishii et al. | |
| 5,593,540 A | 1/1997 | Tomita et al. | |
| 5,643,394 A | 7/1997 | Maydan et al. | |
| 5,714,031 A | 2/1998 | Mundt et al. | |
| 5,716,485 A | 2/1998 | Salimian et al. | |
| 5,746,875 A | 5/1998 | Maydan et al. | |
| 5,779,803 A | 7/1998 | Kurono et al. | |
| 6,010,636 A | 1/2000 | Donohue et al. | |
| 6,036,782 A * | 3/2000 | Tanaka et al. | 118/715 |
| 6,073,577 A | 6/2000 | Lilleland et al. | |
| 6,074,518 A | 6/2000 | Imafuku et al. | |
| 6,148,765 A | 11/2000 | Lilleland et al. | |
| 6,173,673 B1 * | 1/2001 | Golovato et al. | 118/723 E |
| 6,194,322 B1 | 2/2001 | Lilleland et al. | |
| 6,207,006 B1 * | 3/2001 | Katoh | 156/345.29 |
| 6,220,202 B1 | 4/2001 | Foster et al. | |
| 6,230,651 B1 | 5/2001 | Ni et al. | |
| 6,308,654 B1 | 10/2001 | Schneider et al. | |
| 6,350,317 B1 | 2/2002 | Hao et al. | |
| 6,376,385 B2 | 4/2002 | Lilleland et al. | |
| 6,391,787 B1 | 5/2002 | Dhindsa et al. | |
| 6,468,925 B2 * | 10/2002 | Campbell et al. | 438/771 |
| 6,547,921 B2 | 4/2003 | Suzuki et al. | |
| 6,806,653 B2 | 10/2004 | Strang et al. | |
| 6,818,097 B2 * | 11/2004 | Yamaguchi et al. | 156/345.47 |
| 6,913,703 B2 | 7/2005 | Strang et al. | |
| 6,916,401 B2 | 7/2005 | Long | |
| 6,972,071 B1 * | 12/2005 | Tyler | 156/345.47 |
| 7,861,667 B2 | 1/2011 | Fischer et al. | |
| 2002/0127853 A1 | 9/2002 | Hubacek et al. | |
| 2002/0150519 A1 * | 10/2002 | Barnes et al. | 422/186.04 |
| 2003/0106644 A1 * | 6/2003 | Sirkis et al. | 156/345.48 |
| 2003/0176074 A1 * | 9/2003 | Paterson et al. | 438/710 |

FOREIGN PATENT DOCUMENTS

| | | |
|---|---|---|
| JP | 8-274069 A | 10/1996 |
| JP | H08-274069 A | 10/1996 |
| JP | 10-064831 | 3/1998 |
| JP | 410-289881 A | 10/1998 |
| JP | 11-162940 A | 6/1999 |
| JP | H11-162940 A | 6/1999 |
| JP | 2000-164568 A | 6/2000 |
| JP | 2001-217231 A | 8/2001 |
| JP | 2001-313286 A | 11/2001 |
| JP | 2002-519862 A | 7/2002 |
| WO | WO01/63642 A1 | 8/2001 |
| WO | WO 0163642 A1 * | 8/2001 |

OTHER PUBLICATIONS

Written Opinion mailed Jan. 12, 2004 for PCT/US03/16318.
EP Official Action dated Feb. 4, 2010 for European Patent Appln. No. 03729095.4-2208.
KR Official Action dated Apr. 30, 2010 for Korean Patent Appln. No. 2004-7018952.
Examiner's Pre-Review Report Jan. 31, 2011 for Japanese Patent Appln. No. 2004-508375.
Office Action issued Apr. 26, 2013, in corresponding Japanese Patent Application No. 2011-179198, and an English translation thereof.

* cited by examiner

MULTI-PART ELECTRODE FOR A SEMICONDUCTOR PROCESSING PLASMA REACTOR AND METHOD OF REPLACING A PORTION OF A MULTI-PART ELECTRODE

CROSS-REFERENCE TO RELATED APPLICATION

This application is a divisional of U.S. patent application Ser. No. 10/445,146, entitled MULTI-PART ELECTRODE FOR A SEMICONDUCTOR PROCESSING PLASMA REACTOR AND METHOD OF REPLACING A PORTION OF A MULTI-PART ELECTRODE, filed on May 23, 2003, now U.S. Pat. No. 7,861,667 which claims priority to U.S. Provisional Patent Application Ser. No. 60/383,164, filed May 23, 2002, the entire content of each is incorporated herein by reference.

BACKGROUND OF THE INVENTION

1. Field of the Invention

The invention relates to a multi-part upper electrode for a semiconductor processing plasma reactor and a method of replacing an eroded portion of the multi-part upper electrode.

2. Description of the Related Art

Electrodes used in plasma processing reactors for processing semiconductor substrates such as silicon wafers are disclosed in U.S. Pat. Nos. 5,074,456 and 5,569,356, the disclosures of which are hereby incorporated by reference.

Dry plasma etching, reactive ion etching, and ion milling techniques were developed in order to overcome numerous limitations associated with chemical etching of semiconductor wafers. Plasma etching, in particular, allows the vertical etch rate to be made much greater than the horizontal etch rate so that the resulting aspect ratio (i.e., the height to width ratio of the resulting notch) of the etched features can be adequately controlled. In fact, plasma etching enables very fine features with high aspect ratios to be formed in films over 1 micrometer in thickness.

During the plasma etching process, a plasma is formed above the masked surface of the wafer by adding large amounts of energy to a gas at relatively low pressure, resulting in ionizing the gas. By adjusting the electrical potential of the substrate to be etched, charged species in the plasma can be directed to impinge substantially normally upon the wafer, wherein materials in the unmasked regions of the wafer are removed.

The etching process can often be made more effective by using gases that are chemically reactive with the material being etched. So called "reactive ion etching" combines the energetic etching effects of the plasma with the chemical etching effect of the gas. However, many chemically active agents have been found to cause excessive electrode wear.

It is desirable to evenly distribute the plasma over the surface of the wafer in order to obtain uniform etching rates over the entire surface of the wafer. For example, U.S. Pat. Nos. 4,595,484, 4,792,378, 4,820,371, 4,960,468 disclose showerhead electrodes for distributing gas through a number of holes in the electrodes. These patents generally describe gas distribution plates having an arrangement of apertures tailored to provide a uniform flow of gas vapors to a semiconductor wafer.

A reactive ion etching system typically consists of an etching chamber with an upper electrode or grounded electrode and a lower electrode or RF electrode positioned therein. The wafer to be etched is covered by a suitable mask and placed directly on the RF electrode. The wafer is negatively biased as a result of its interaction with the plasma. A chemically reactive gas such as $CF_4$, $CHF_3$, $CClF_3$, and $SF_6$ or mixtures thereof with O, $N_2$, He, or Ar is introduced into the etching chamber and maintained at a pressure which is typically in the millitorr range. The grounded electrode is provided with gas holes which permit the gas to be uniformly dispersed through the electrode into the chamber. The electric field established between the grounded electrode and the RF electrode will dissociate the reactive gas forming a plasma. The surface of the wafer is etched by chemical interaction with the active ions and by momentum transfer of the ions striking the surface of the wafer. The electric field created by the electrodes will attract the ions to the wafer, causing the ions to strike the surface in a predominantly vertical direction so that the process produces well-defined vertically etched side walls.

The exposed surfaces of the upper electrode are also etched during wafer processing. Electrode loss or etching results in a need to periodically replace the upper electrode. Thus, it would be desirable to make electrode replacement simple and economical.

As substrate size increases it is important to ensure uniform etching and deposition with increasingly large wafer sizes and correspondingly large electrode sizes. The industry move from 200 mm to 300 mm wafers allows manufacturers to double their wafer area and chip output. The increase in wafer size results in certain difficulties in scaling up of the wafer processing tools. For example, single crystal silicon boules used to make some upper electrodes are manufactured in sizes up to 15 inches, in diameter. The larger diameter single crystal silicon electrodes are difficult to manufacture with the desired low impurity levels. Thus, the large diameter single crystal silicon electrodes are costly.

An upper showerhead electrode 10 and a smaller lower electrode 12 for a single wafer etch chamber are shown in FIG. 1. The configuration of FIG. 1 shows an electrode configuration for a capacitively coupled, confined plasma etch chamber with one electrode powered by two RF sources at different frequencies and the other electrode grounded. The lower electrode 12 is a flat electrode on which a wafer W is supported. The lower electrode 12 is spaced 1 to 2 cm below the upper electrode 10. In this configuration, the upper electrode 10 has a step 14 ground into the electrode providing an electrode with a thinner inner portion, an angled step portion, and a thicker outer perimeter. The step 14 has been designed to provide etch rate uniformity at the edge of the chip.

The electrode 10 has a diameter of 15" to accommodate 300 mm wafers. An extension 16 of the electrode 10 is provided which extends the electrode from 15" to 17" and is constructed of a plurality of silicon segments. This configuration requires a single crystal silicon electrode 10 having a diameter of 15" which is then ground to form the step 14. This large diameter electrode 10 is quite costly and requires periodic replacement due to wear.

SUMMARY OF THE INVENTION

The present invention relates to a multi-part upper electrode for a semiconductor processing reactor with a replaceable portion and a method of replacing a portion of the electrode.

In one embodiment, a multi-part electrode for a plasma reaction chamber includes an electrode top plate and an electrode connected to the top plate. The electrode includes a central silicon element and a plurality of silicon segments surrounding the central silicon element. The central silicon element is removable from the top plate independent of the silicon segments.

In another embodiment, a plasma processing system includes a plasma processing chamber, a substrate support within the plasma processing chamber, an RF energy source, a lower electrode, and an upper electrode. The upper electrode includes an electrode top plate, central electrode element secured to the top plate, and a plurality of electrode segments secured to the top plate surrounding the central electrode element. The electrode segments can be formed of the same material as the central electrode element and a joint between the electrode segments and the central electrode is positioned where erosion of the electrode drops from high wear to low wear.

In another embodiment, a multi-part electrode for a plasma reaction chamber includes an electrode top plate and an electrode connected to the top plate. The electrode includes a central electrode element having a diameter of about 13 inches or less and a plurality of electrode segments surrounding the central electrode element to create a total electrode diameter of at least 16 inches. The central electrode element is removable from the top plate independent of the electrode segments.

In a further embodiment, a method of replacing a portion of an electrode in a plasma reaction chamber, includes the steps of providing an upper electrode in a plasma processing chamber, removing the central electrode from the top plate when it becomes eroded, and replacing the central electrode with a new central electrode. The upper electrode comprising a central electrode element and a plurality of electrode segments surrounding the central electrode element. The central electrode and the electrode segments are independently secured to a top plate of the electrode.

BRIEF DESCRIPTION OF THE DRAWING FIGURES

The invention will now be described in greater detail with reference to the preferred embodiments illustrated in the accompanying drawings, in which like elements bear like reference numerals, and wherein.

DETAILED DESCRIPTION OF THE INVENTION

The present invention provides an improved upper electrode system with a multi-part electrode in which a central portion of the electrode having high wear is replaceable independent of an outer peripheral portion of the electrode. The upper electrode can be used in plasma processing systems for processing semiconductor substrates, such as by etching or CVD. The multi-part upper electrode system is particularly useful for large size wafer processing chambers, such as 300 mm wafer processing chambers for which monolithic electrodes are unavailable or costly.

Figure 1:
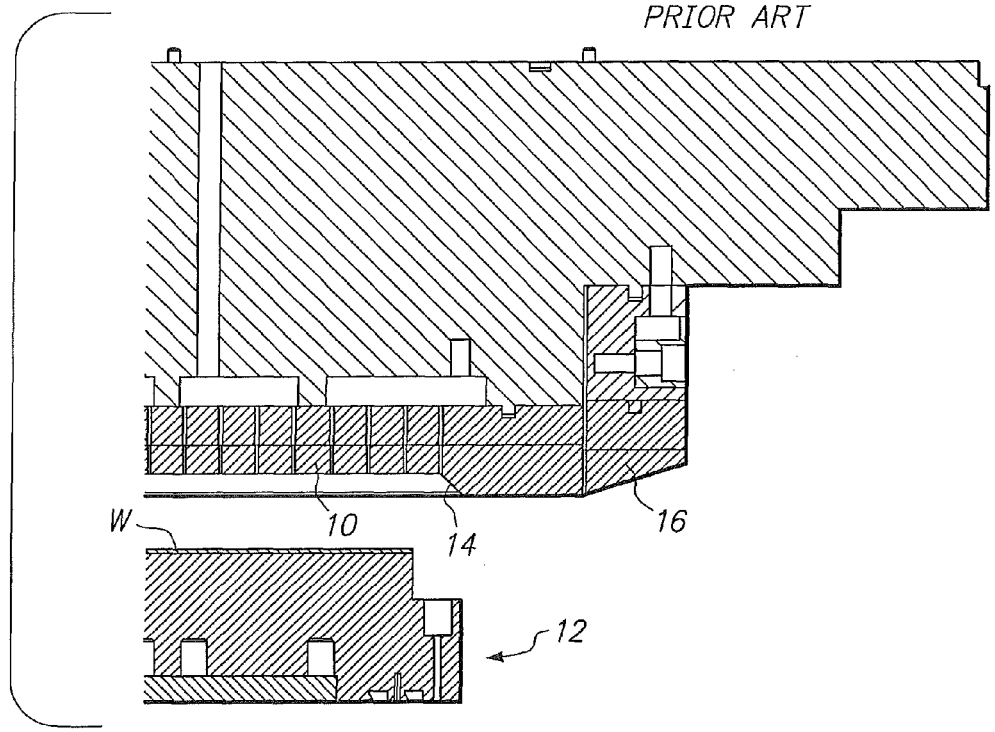
FIG. 1 is a side cross sectional view of a portion of upper and lower electrodes in a prior art wafer processing chamber.
Figure 2:
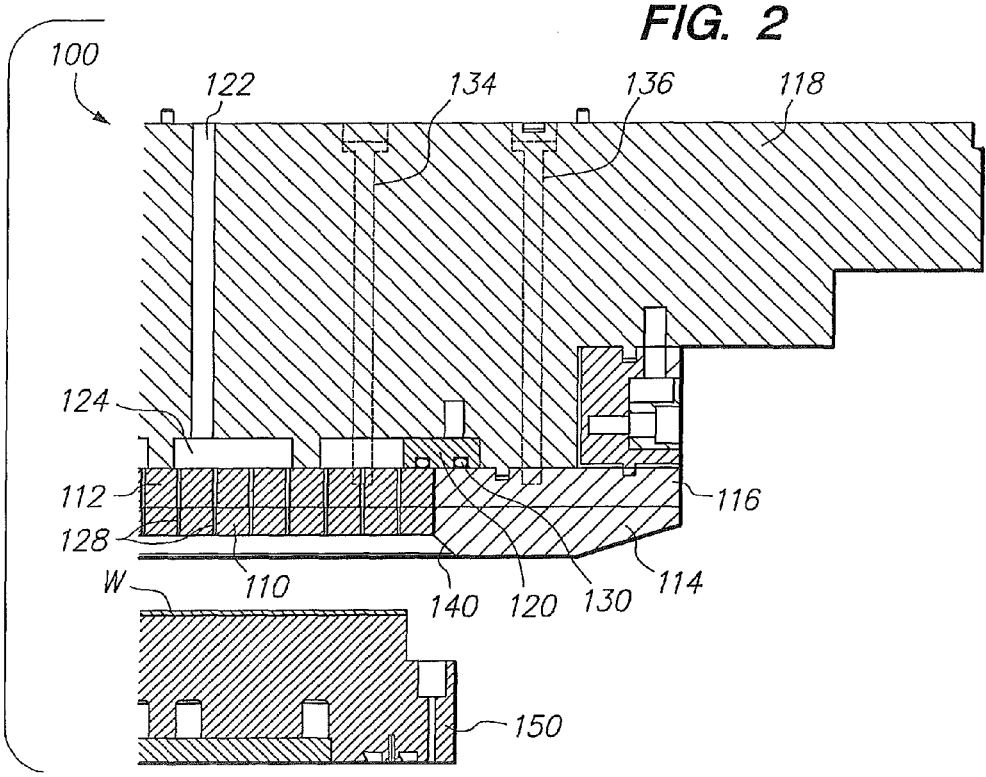
FIG. 2 is a side cross sectional view of a portion of a wafer processing chamber having a multi-part electrode with a replaceable central electrode element.

FIG. 2 illustrates a portion of a plasma processing system 100 having an improved upper electrode system allowing replacement of a portion of the upper electrode. As shown in FIG. 2, a central electrode element 110 is mounted on a backing plate 112 by a thermally and electrically conductive elastomer. A plurality of segmented electrodes 114 form a ring around the central electrode 110 and are also mounted to a backing plate 116. The electrode backing plates 112, 116 are secured to a top plate 118 in a removable manner. A processed gas is delivered through a channel 122 in the top plate 118 to a plurality of channels 124 above the backing plate 112. The process gas is delivered to the wafer processing chamber through a plurality of perforations 128 in the electrode 110 and backing plate 112 which are in the form of a showerhead electrode.

A sealing ring 120 is provided between the top plate 118, and the backing plates 112, 116 to prevent gas flow from the channels 124 into the annulus between the central electrode 110 and the electrode segments 114. The sealing ring 120 is provided with O-rings 130 in annular channels in the sealing ring to provide a gas tight seal.

A step 140 is provided in the electrode segments 114 which has been designed to provide etch rate uniformity at the edge of the wafer W. The step 140 is substantially aligned above an edge of a bottom electrode 150 and is positioned just outside the edge of the wafer W.

The electrode segments 114 may include any number of segments for example, 3 to 10 segments can be used.

The electrodes 110, 114 are secured to the top plate 118 by threaded screws 134, 136 extending from the back side of the top plate and into the backing plates 112, 116. The threaded screws 134, 136 allow the independent removal of the central electrode 110 and the electrode segments 114 when required. Since the wear of the central electrode 110 is estimated to be two to three times the rate of wear on the electrode segments 114 the central electrode can be removed and replaced more often than the outer electrode segments.

Figure 3:
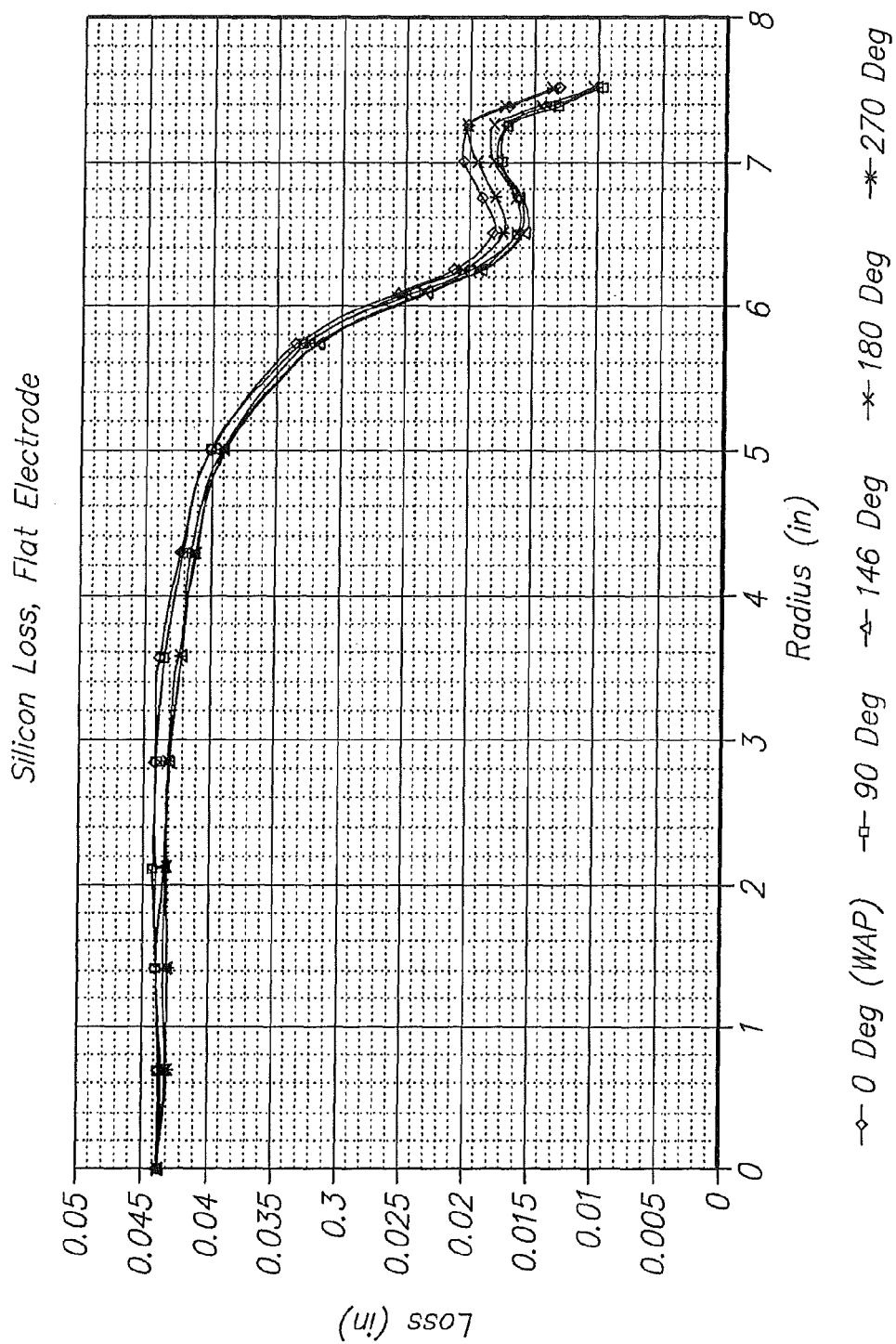
FIG. 3 is a graph of the silicon loss across a flat electrode.

FIG. 3 illustrates the etch rate or silicon loss of a silicon upper electrode having a flat shape at different diameters of the electrode. As can be seen in FIG. 3, the loss or rate of etching of the silicon electrode decreases significantly at a radius of between 5" and 6.5" from the center of the electrode. Accordingly, it can be seen that a portion of the electrode outside of about 6.5" in diameter can be replaced less frequently than the central portion of the electrode.

Examples of materials which may be used for the central electrode 110 and the surrounding electrode segments 114 include SiC, SiN, AlN, and $Al_2O_3$. One particularly preferred material for the electrodes 110 and 114 has been found to be silicon since it introduces no additional unwanted elements into the reaction and erodes smoothly creating very few particles. Either single crystal silicon or poly crystalline silicon may be used.

The backing plates 112 and 116 to which the electrodes 110 and 114 are secured, should be chemically compatible with the process gas, match the coefficient of thermal expansion of the electrodes, be electrically and thermally conductive, and have sufficient mechanical strength to allow fastening to the conductive top plate 118. Examples of materials which can be suitable for use as the backing plates include graphite and SIC.

The top plate 118 should be formed of a material which is chemically compatible with the process gas, is electrically and thermally conductive, and has sufficient mechanical strength to support the backing plates and the electrodes. One example of the material for the top plate is aluminum.

The sealing ring 120 can be formed from aluminum SiC, silicon, graphite, or quartz, or other materials which are acceptable for use in a plasma processing system.

In addition to the bonding of the electrodes 110 and 114 to the corresponding backing plates 112 and 116 with a thermally and electrically conducted elastomer, a support member such as an aluminum mesh can be provided between the electrodes and the backing plates to assure stable electrical and thermal contact over the lifetime of the electrode.

The electrode segments 114 may each be fixed to an independent segment of backing plate 116 or all of the electrode segments 114 can be bonded onto a single backing ring allowing the electrode segments 114 to be removed together in a single step.

Example

One example of a configuration for the plasma processing system 100 of FIG. 2 includes a central electrode element 110 cut from a 12" single crystal silicon boule. The central electrode element 110 has a thickness of about 0.25" and an entirely planar lower surface. This diameter is much less expensive to manufacture than a 15" single crystal silicon electrode due to the large commercial production of 12" single crystal silicon boules for production of 300 mm wafers. The outer segmented portion of the electrode is fabricated from single crystal silicon segments which can be cut from 12" diameter single crystal silicon and bonded to a ring-shaped graphite backing plate 116. In this example, six electrode segments are bonded to a ring-shaped graphite backing plate 116 with the electrode segments 114 having a thickness of about 0.5" and an angled step 140 ground at an angle of about 45 from the thickness of 0.5" down to a thickness of 0.25" at the inner diameter of the segments. The electrode segments 114 together form a ring having an inner diameter of about 12" and an outer diameter of about 17". The sealing ring 120 is a quartz ring with elastomeric O-rings and the top plate 118 is formed of Aluminum.

In the 300 mm wafer processing system described in the above example (with a flat electrode), it has been shown that erosion of the silicon upper electrode drops sharply at a radius of about 5" to about 6.5" (see FIG. 3). Accordingly, the joint between the central electrode 110 and the electrode segments 114 is positioned at about 5" to about 6½" from a center of the electrode, preferably at a radius of about 6". Putting the break between the inner and outer parts of the electrode at about 6" will allow replacement of the more highly wearing central electrode element 110 independent of the electrode segments 114. The outer electrode segments 114 should experience 2-3 times the life of the central electrode 110 reducing costs of electrode replacement. The placement of the joint radially inward of the step 140 also allows the use of a central electrode 110 having a smaller thickness and thus further reduces costs.

While the invention has been described in detail with reference to the preferred embodiments thereof, it will be apparent to one skilled in the art that various changes and modifications can be made and equivalents employed, without departing from the present invention.

What is claimed is:

1. A replaceable electrode for a plasma reaction chamber wherein the replaceable electrode forms part of an upper electrode of the plasma reaction chamber, comprising:
    a ring shaped backing plate;
    a plurality of electrode segments forming a ring shaped electrode;
    an electrically conductive elastomer securing the plurality of electrode segments to the ring shaped backing plate; and
    wherein the plurality of electrode segments form a ring having an inner edge and a plasma-exposed angled surface extending outwardly from the inner edge and wherein the ring shaped backing plate comprises bores for securing the electrode to a top plate in the plasma reaction chamber.

2. The electrode of claim 1, wherein the electrode segments each have a step configured to surround a central electrode element such that the central electrode element is recessed inside the electrode segments.

3. The electrode of claim 1, wherein the electrode segments are configured to surround a central electrode element to create a total electrode diameter of at least 16 inches.

4. The electrode of claim 1, wherein the electrode segments include a stepped lower surface.

5. The electrode of claim 1, wherein the bores in the ring shaped backing plate receive a plurality of threaded screws.

6. The electrode of claim 1, wherein the plurality of electrode segments are formed of a single crystal silicon, poly crystal silicon, or silicon carbide.

7. The electrode of claim 1, wherein the backing plate is formed of graphite or silicon carbide.

8. The electrode of claim 1, wherein the electrode further comprises a sealing ring located above the backing plate, the sealing ring formed from aluminum, SiC, silicon, graphite, or quartz.

9. The electrode of claim 1, wherein the plurality of electrode segments comprises 3-10 segments.

10. The electrode of claim 1, wherein the electrically conductive elastomer is thermally conductive.

11. The electrode of claim 1, further comprising an aluminum mesh between the electrode and the backing plate.

12. The electrode of claim 1, wherein the plurality of electrode segments form a ring having an inner diameter of at least 12 inches and an outer diameter of about 17 inches.

13. The electrode of claim 8, wherein the sealing ring comprises at least one annular groove.

14. The electrode of claim 1, wherein the backing plate is formed from graphite.

* * * * *